United States Patent [19]

Hellerman

[11] Patent Number: 4,769,628

[45] Date of Patent: Sep. 6, 1988

[54] HIGH SPEED ANALOG-TO-DIGITAL CONVERTER UTILIZING MULTIPLE, IDENTICAL STAGES

[76] Inventor: David S. Hellerman, 32 E. Minnehaha Pkwy., Minneapolis, Minn. 55419

[21] Appl. No.: 60,687

[22] Filed: Jun. 11, 1987

[51] Int. Cl.$^4$ .......................... H03M 1/68; H03M 1/72
[52] U.S. Cl. .................................................. 341/162
[58] Field of Search ...... 340/347 AD, 347 C, 347 CC, 340/347 M

[56] References Cited

U.S. PATENT DOCUMENTS

| | | | |
|---|---|---|---|
| 3,119,105 | 1/1964 | Jepperson | 340/347 AD |
| 3,187,325 | 6/1965 | Waldhauer | 340/347 AD |
| 3,676,702 | 7/1972 | McGrogan, Jr. | 307/279 X |
| 3,918,050 | 11/1975 | Dorsman | 340/347 AB |
| 4,075,623 | 2/1978 | Futagawa et al. | 340/347 NT |
| 4,191,942 | 3/1980 | Long | 340/347 AD |
| 4,323,887 | 4/1982 | Buurma | 340/347 AD |
| 4,550,308 | 10/1985 | Tokura et al. | 340/347 NT |
| 4,556,870 | 12/1985 | Brokaw et al. | 340/347 AD |
| 4,558,301 | 12/1985 | Trofimenkoff et al. | 340/347 AD |
| 4,568,913 | 2/1986 | Evans | 340/347 NT |
| 4,571,574 | 2/1986 | Krynicki | 340/347 DA X |
| 4,573,037 | 2/1986 | Robinton et al. | 340/347 NT |
| 4,584,566 | 4/1986 | Arcara | 340/347 AD |
| 4,598,270 | 7/1986 | Shutt et al. | 340/347 NT |
| 4,618,848 | 10/1986 | Parfitt | 340/347 CC |
| 4,644,322 | 2/1987 | Fujita | 340/347 AD |
| 4,644,323 | 2/1987 | Chamran et al. | 340/347 NT |
| 4,647,905 | 3/1987 | Hantke et al. | 340/347 NT |

OTHER PUBLICATIONS

The Engineering Staff of Analog Devices, Inc., Analog-Digital Conversion Handbook, 6/1972, pp. I-1 to I-3; II-83 to II-87; III-1 to III-5.
Landee et al, Electronic Designers' Handbook, 1957, McGraw-Hill Book Co., Inc., pp. 15-17 & 15-18.
Herman Schmid, Electronic Analog/Digital Conversions; 1970, pp. 313-317; Van Nostrand Reinhold Company.
David F. Hoeschele, Jr.; Analog-to-Digital/-Digital-to-Analog Conversion Techniques; 1968; pp. 364, 365, 398-413, 428 & 429; John Wiley & Sons, Inc.
Blanchard D. Smith, Jr.; An Unusual Electronic Analog-Digital Conversion Method; 1956; pp. 155-160; IRE Transactions on Instrumentation, vol. PGI-5.
Bernard M. Gordon, Linear Electronic Analog/Digital Conversion Architectures, Their Origins, Parameters, Limitations, and Applications; 1978; pp. 391-418; IEEE Transactions on Circuits and Systems, vol. CAS-25, No. 7.
Burr-Brown Research Corporation-Fall 1968 Catalog; Add-A-Bit A/D Converters.

Primary Examiner—T. J. Sloyan
Attorney, Agent, or Firm—Orrin M. Haugen; Thomas J. Nikolai; Frederick W. Niebuhr

[57] ABSTRACT

An analog-to-digital converter circuit includes a series of substantially identical stages, each receiving an incoming analog voltage. Reference terminals of the initial stage are biased to an initial reference voltage and ground, with subsequent first and second reference voltages determined in each preceding stage. A voltage divider consisting of a pair of matched resistors provides an output of one-half the reference voltage to a comparator. The comparator, having as its other input the incoming analog signal, generates a binary "one" or "zero" depending on whether the incoming signal is greater or less than the voltage divider output. The binary signal also controls switching circuitry which provides first and second reference signals to the next stage of the A/D converter. Responsive to a binary one from the converter, these reference signals are the reference voltage and one-half the reference voltage, respectively. A binary zero produces one-half the reference voltage and ground as the respective first and second reference signals.

13 Claims, 3 Drawing Sheets

HIGH SPEED ANALOG-TO-DIGITAL CONVERTER UTILIZING MULTIPLE, IDENTICAL STAGES

BACKGROUND OF THE INVENTION

This invention relates to analog-to-digital (A/D) converters, and more particularly to circuitry for high speed conversion of analog signals to digital signals.

Analog-to-digital converters are widely employed for converting analog voltages into corresponding digital signals for processing by digital computers, and have been constructed according to a number of alternative approaches. One approach involves integrating the analog input signal to generate a ramp signal of a predetermined slope and for a time corresponding to the analog input. This technique is disclosed, for example, in U.S. Pat. No. 4,647,905 (Hantke et al) granted Mar. 3, 1987, showing a circuit with three integrators, each including an operational amplifier and a capacitor wired to the amplifier. Similarly, U.S. Pat. No. 4,558,301 (Trofimenkoff) granted Dec. 10, 1985 discloses a voltage-to-frequency and analog-to-digital conversion circuit utilizing a microprocessor to control the charge and discharge of a capacitor.

Another approach, known as successive approximation, is shown in U.S. Pat. No. 4,323,887 (Buurma) granted Apr. 6, 1982, employing CMOS construction in converting a digital word to analog voltages which are compared with the analog input. The most significant bit of the digital word is determined in accordance with whether the analog input is greater or less than half of the reference voltage. Then, the next most significant bit is evaluated, with the process continuing until evaluation of the least significant bit.

For higher speed applications, a parallel conversion technique may be employed as described in U.S. Pat. No. 4,644,322 (Fujita) granted Feb. 17, 1987. The A/D converter in Fujita includes a voltage divider having $2^n$ junctions connected in series between a reference voltage terminal and a ground terminal, along with $2^n$ comparators for receiving outputs of the respective divider junction. This technique, also known as flash conversion, requires at least $2^n - 1$ comparators to produce a digital word of n bits representative of the analog signal.

Another high speed conversion technique combines a flash approach with successive approximation. A hybrid converter digitizes a group of the most significant bits, for example the first four, and converts these bits into an analog signal, which is then subtracted from the analog input. The difference is amplified and converted to a digital signal. This converter uses $2^n - 1$ comparators for the n most significant bits, $2^m - 1$ comparators for the m least significant bits, and one further comparator.

While the above devices all have utility in certain applications, the above-discussed parallel conversion and hybrid devices have a comparator requirement that increases exponentially with the number of desired bits. Such devices therefore become prohibitively complex. On the other hand, the integration and successive approximation approaches are considered too slow for many uses. There remains a need for a simple, low cost and reliable A/D converter capable of operating at high speeds and with high precision.

Therefore, it is an object of the present invention to provide an analog-to-digital converter having a complexity directly proportional to the desired precision or number of bits in the digital word output.

Another object of the invention is to provide an A/D converter requiring no preliminary processing of the input analog signal and operable without a clock.

Another object is to provide an A/D converter comprised of multiple, substantially identical stages.

Yet another object is to provide a reliable A/D converter manufactured as a low cost integrated circuit requiring a minimal amount of space on an IC chip.

SUMMARY OF THE INVENTION

To achieve these and other objects, there is provided a multiple stage analog-to-digital converter, including an analog input terminal for receiving an analog voltage, a first reference terminal biased to a first predetermined reference voltage greater than the analog voltage, and a second reference terminal biased to a second reference voltage having a predetermined level less than the analog voltage. The converter further includes a plurality of stages of circuitry for generating a binary word of n bits corresponding to the analog voltage, n being an integer. Each stage includes a voltage dividing means for receiving first and second reference voltage signals and generating a divider output voltage between the reference voltage signals. Each stage further includes a comparator means, having as inputs the analog voltage and the divider output voltage of its associated divider. The comparator generates a first binary signal whenever the analog voltage is greater than the divider output voltage, and generates a second binary signal whenever the analog voltage is less than the divider output voltage. Each stage further includes a switching means receiving as inputs the first reference voltage, second reference voltage and the divider output voltage, and also receiving the binary signal as a control input. When the switching means receives the first binary signal as its control input, it generates the first reference voltage and divider output voltage as first and second switching output voltages, respectively. When the switching means receives the second binary signal as its control input, it generates the divider output voltage and second reference voltage as the first and second switching output voltages. The first and second reference signals for each subsequent stage are the first and second switching outputs from the preceding stage. The comparators cooperate to generate a binary word of n bits representing the voltage level of the analog signal.

Preferably, each of the dividing means includes two matched resistors in series between the first and second reference signals, with the output of a dividing means positioned between the resistors. The resultant dividing means output is equal to the average of the first and second reference signal voltages. An operational amplifier, acting as a unity gain follower, is positioned between each dividing means and its associated comparator means to enhance the stability of each stage. Also, for applications with an expected high slew rate, a binary register may be connected for receiving and holding the digital input of each of the comparator means.

A preferred switching means includes a bank of four CMOS switches, with two of the CMOS switches adapted to be closed responsive to receiving the first binary signal, and the other CMOS switches closed responsive to receiving the second digital signal.

A pair of operational amplifiers functioning as unity gain followers can be connected between the first and second switching outputs of each switching means and the subsequent stage. A bypass capacitor can be connected between the amplifiers in order to reduce or eliminate transients. This arrangement increases the complexity of the A/D converter, but yields substantial advantages. For example, because of the amplifiers, the voltage divider resistors can be much smaller. This improves processing speed, because residual capacitance at the operational amplifier inputs becomes less significant. Further, current through the switches can be substantially reduced, so that the voltage drop across the switches and associated errors are substantially eliminated. In a further improvement, low resistances can be connected in series with the switching means outputs, to reduce make-before-break transients. Consequently, the internal resistance of the switches is not critical, enabling use of faster, lower cost switches.

An A/D converter in accordance with the present invention processes signals rapidly and is simple in design. The comparator of each stage is directly connected to the terminal receiving the analog signal, so that all stages receive the incoming analog signal virtually simultaneously. Also, the reference voltages for each stage are determined by the binary number generated in the previous stage, so that the entire signal conversion occurs essentially at the signal propagation speed through the converter. An added benefit is that no clock is required. While recommended for high data slew rates, an output latch is not essential in other cases.

Simplicity and low cost arise from the fact that the complexity increases in direct proportion to the number of stages employed, rather than in an exponential fashion. More particularly, conversion to a level of an eight-bit digital word requires eight stages, and therefore eight comparators —not $2^8$ (256), or $2^4+2^4+1$ (33) as in conventional designs having a comparable signal processing rate.

The A/D converter preferably is embodied as an integrated circuit on a single chip. Given the premium value of integrated circuit chip surface area, and the corresponding need to reduce the size of electric circuits, the present A/D converter is particularly well suited for IC fabrication. IC fabrication is made easier, and costs are reduced, due to the use of simple, repeatable cells or stages.

IN THE DRAWINGS

For a better appreciation of the above and other features and advantages, reference is made to the following detailed description and drawings, in which.

DETAILED DESCRIPTION OF THE PREFERRED EMBODIMENTS

Figure 1:
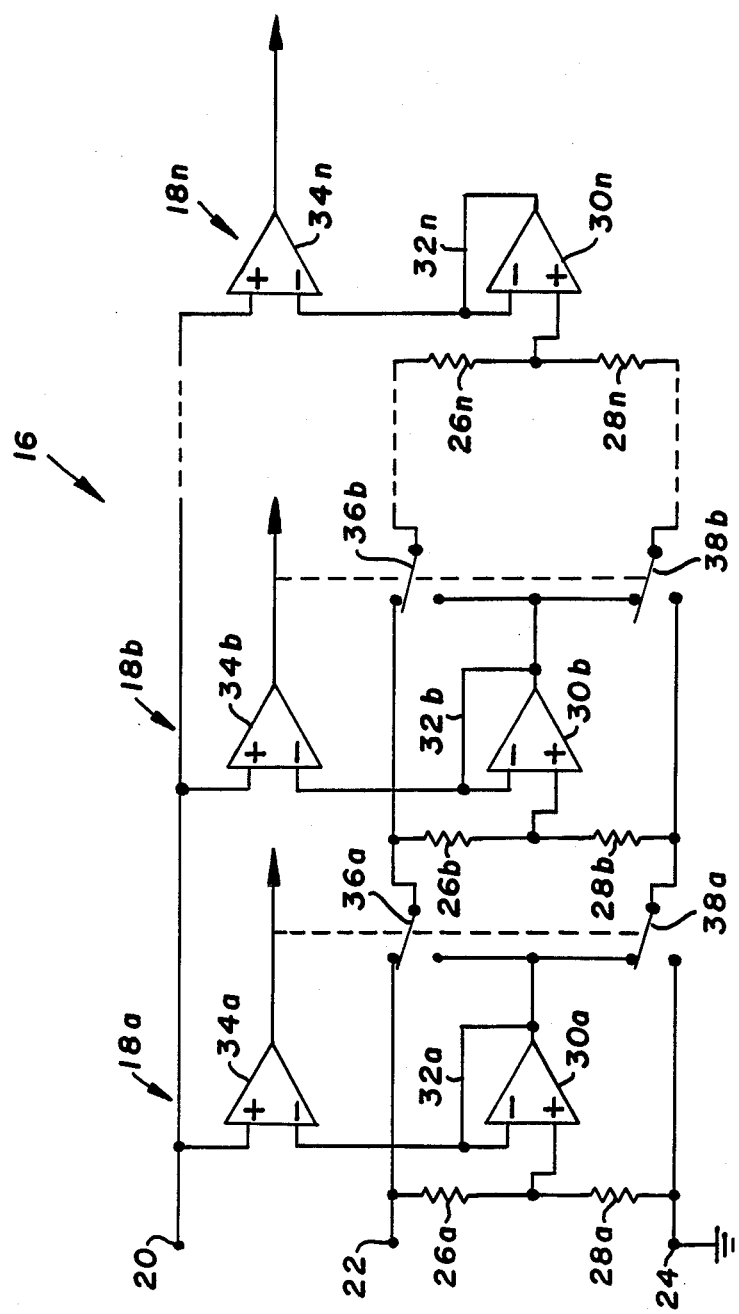
FIG. 1 is a schematic circuit representation of an analog-to-digital converter constructed in accordance with the present invention.

Turning now to the drawings, there is shown in FIG. 1 the schematic circuitry for an analog-to-digital converter 16 arranged in multiple stages including a first stage 18a, a second stage 18b and a final stage 18n. Input terminals to stage 18a include an analog input terminal 20 for receiving the analog voltage signal to be converted, a first reference terminal 22 biased to a reference voltage level which greater than the expected maximum value of the incoming analog signal, and a second reference terminal 24 preferably biased to ground, but in any event lower than the expected minimum value of the incoming analog signal.

Connected in series between reference terminals 22 and 24 is a voltage divider including a pair of matched resistors 26a and 28a. The voltage divider output, taken between resistors 26a and 28a and thus equal to half of the reference voltage, is supplied to the positive terminal of an operational amplifier 30a. Amplifier 30a includes a feedback loop 32a to its inversion terminal, and functions as a unity gain follower.

The output of amplifier 30a, equal to half the reference voltage, is provided to the inversion input of a comparator 34a which receives the incoming analog voltage at its positive terminal. Comparator 34a generates a binary output based upon the relationship between the unknown analog voltage and the operational amplifier output of half the reference voltage. More particularly, comparator 34a generates a binary "one" whenever the incoming voltage is greater than the op amp output, and a binary "zero" whenever the analog voltage is less than the op amp output. In short, the range in voltage between ground and the reference voltage is divided into two halves, with the output of comparator 34a indicating which half or segment is occupied by the analog voltage.

The binary output of comparator 34a also is provided to a switching circuit, represented in FIG. 1 by a pair of two-position switches 36a and 38a, as a switching control input. The inputs to switch 36a include the reference voltage and one-half the reference voltage, while the corresponding inputs to switch 38a include one-half the reference voltage and ground.

Whenever the output of comparator 34a is a binary one, switches 36a and 38a are each biased into a "high" position as shown in FIG. 1, whereupon the outputs of switches 36a and 38a are the reference voltage and one-half of the reference voltage, respectively. Alternately, a binary zero as the comparator output repositions switches 36a and 38a to their respective low positions, in which case the outputs of these switches are one-half the reference voltage and ground, respectively.

The output of switches 36a and 38a are provided as first and second reference signals to second stage 18b of the A/D converter, which preferably is substantially identical to the first stage 18a. A voltage divider including matched resistors 26b and 28b provides a divider output to an operational amplifier 30b, equal to half the sum of the first and second reference signal voltages. A comparator 34b compares the incoming analog voltage with the output of op amp 30b, and generates a binary signal based on the comparison, providing the next most significant bit for digital readout, and providing the control input to a pair of switches 36b and 38b.

This process continues until the final reference signals are provided to a final voltage divider including matched resistors 26n and 28n, providing the final divider output to an operational amplifier 30n, the output of which is provided to the inverting terminal of a final comparator 34n, which compares the op amp output and the incoming analog signal to produce the binary number indicating the least significant bit.

Thus, the binary outputs of comparators 34 together provide a digital word representing the voltage of the analog signal, beginning with the most significant bit and extending to the least significant or "nth" bit. The precision of signal conversion corresponds to the number of stages, each stage doubling the precision in that the nth stage provides $2^n$ possible digital numbers, in effect dividing the voltage between the initial reference signal and ground into $2^n$ equal segments.

The resistors 26 and 28 in each stage must of course be carefully matched, although the absolute resistance of each is not critical. The operational amplifiers 30 and comparators 34 must have good DC offset characteristics and be capable of high speed operation. Also, the switches 36 and 38 must be configured to break before make.

When these requirements are satisfied, A/D comparator 16 performs the analog-to-digital conversion at high speed, essentially limited only by the signal propagation speed through the successive stages. Speed is enhanced by the fact that the unknown analog voltage is a direct input to the comparator 34 at each stage, and also by the fact that each comparator 34, while providing its binary signal output, also is providing the control signal which determines the reference signals provided to the next subsequent stage. A substantial benefit of this arrangement is that it requires no processing or modification of the input signal, and no clock.

Figure 2:
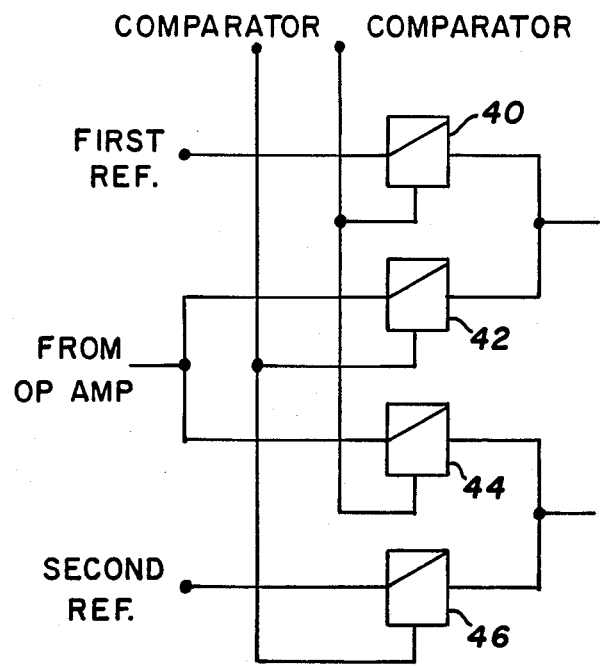
FIG. 2 is a partial, more detailed representation of part of the circuit of FIG. 1.

FIG. 2 shows a preferred configuration for the switching circuitry in each stage, represented in FIG. 1 by switches 36 and 38. A bank of four CMOS switches is provided, including first, second, third and fourth switches 40, 42, 44 and 46. The first reference voltage is provided to first switch 40, the second reference voltage is provided to fourth switch 46, while the second and third switches 42 and 44 receive the output of their associated operational amplifier 30, namely one-half the sum of the first and second reference voltages. First and third switches 40 and 44 receive the binary output of their associated comparator 34 as the control input, while the corresponding control input of switches 42 and 46 is the inverted comparator output. Thus, the first and third switches are closed whenever the comparator output is a binary one or high, and otherwise remain open. The second and fourth switches are open only when the output of comparator 34 is low.

Figure 3:
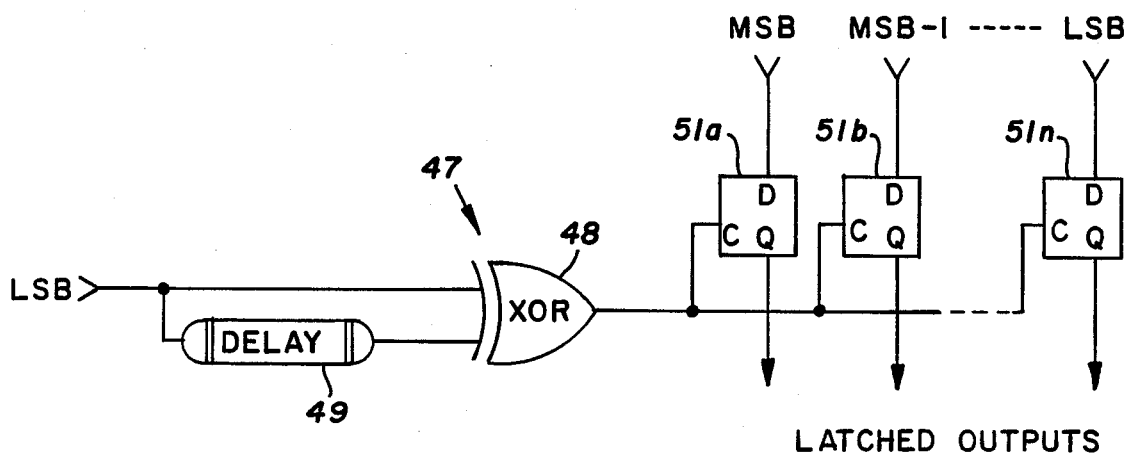
FIG. 3 is a diagrammatic view of an optional output latch for the circuit in FIG. 1.

FIG. 3 shows an optional output latch 47 for receiving the output of comparators 34a-n and temporarily holding the results to provide the digital word indicating the analog voltage. The output latch includes an exclusive OR gate 48, which receives as inputs the least significant bit, and the least significant bit through a delay element 49. The output of OR gate 48 is provided to the data input of each of a plurality of positive edge triggered D-type flip-flops 51a-n. Each of flip-flops 51a-n receives the output of its corresponding one of comparators 34a-n, thus to receive all the comparator binary outputs, from the most significant bit to the least significant bit.

In operation, exclusive OR gate 48 generates a pulse upon each transition of the least significant bit, and provides the pulse to the clock input of each flip-flop. The length of the pulse is controlled by delay element 49, which can consist of a resistor-capacitor network, a logic buffer including two inverters in series, or other known arrangement.

While output latch 47 is not essential in all cases, it should be employed whenever the expected slew rate is high. Since a change in least significant bit, responsive to a change in the incoming analog signal, can occur only after any corresponding changes in the more significant bits, the triggering of output latch 47 with the least significant bit ensures that no latching of data will occur during the brief propagation delay through converter 16.

Figure 4:
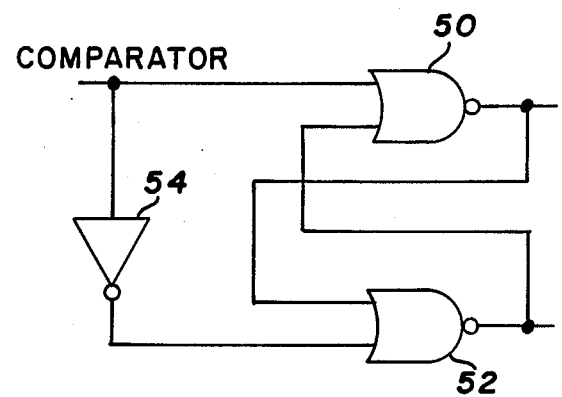
FIG. 4 is a diagram of the switching logic employed in connection with the circuit of FIG. 1.

FIG. 4 shows a switching logic which can be employed in connection with the A/D converter in FIG. 1 to ensure break before make behavior of the switching circuitry. The logic includes first and second NOR gates 50 and 52, with the binary output of one of comparators 34 supplied directly to first NOR gate 50, and through an inverter 54 to second NOR gate 52. The output of NOR gate 50 is the inverted comparator output, while NOR gate 52 provides the comparator output. The output of each NOR gate is provided as an input to the other. Thus, for example, if the binary comparator output is high, NOR gate 50 is off, while NOR gate 52 is on. Should the converter output shift to low, NOR gate 52 is turned off, and at an instant before first NOR gate 50 can become active, since the signal indicating that second NOR gate 52 is off must reach first NOR gate 50 before it is turned on.

Figure 5:
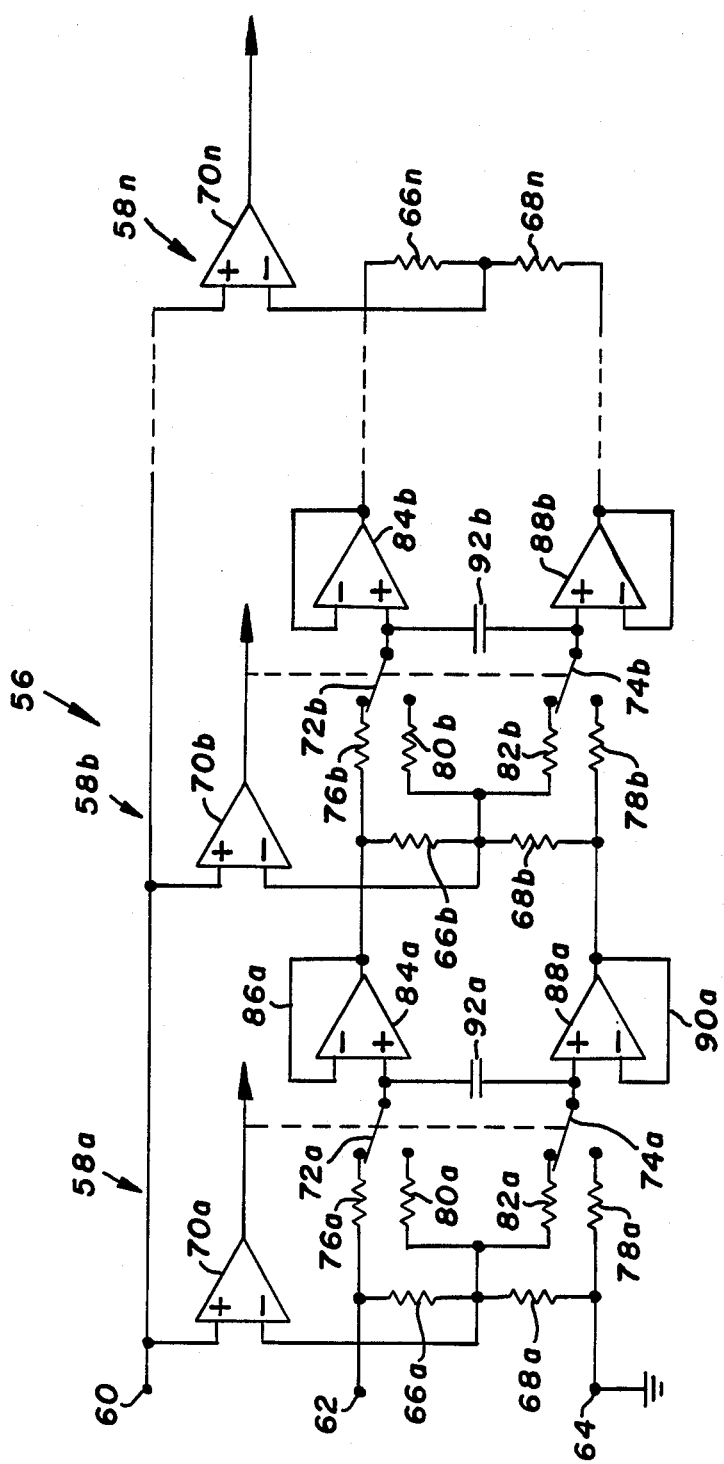
FIG. 5 is a schematic circuit representation of a second embodiment of the A/D converter.

FIG. 5 shows the multiple stage circuitry for an alternative embodiment A/D converter 56 including stages 58a-n constructed in accordance wit the present invention. An analog input terminal 60 is provided to receive the unknown incoming analog signal. First and second reference terminals 62 and 64 are biased to an initial reference voltage and ground, respectively. A voltage divider includes matched resistors 66a and 68a connected in series between the first and second reference terminals. The voltage divider output is provided to the inversion terminal of a comparator 70a, where it is compared with the incoming analog signal voltage to yield a binary one or zero depending on whether the incoming voltage is more or less than the divider output voltage.

The binary signal also provides the control input to first and second two-position switches 72a and 74a. A switching resistor 76a is connected in series between first reference terminal 62 and the high input terminal of switch 72a. A switching resistor 78a is connected in series between ground and the low input terminal of second switch 74a. The voltage divider output is provided to the low terminal of first switch 72a and the high terminal of second switch 74a through switching resistors 80a and 82a, respectively.

The output terminal of each of switches 72a and 74a is connected to an associated unity gain follower. More particularly, the output terminal of switch 72a is connected to the positive terminal of an operational amplifier 84a having a feedback loop 86a to its inversion terminal, while the output of second switch 74a is similarly connected to an operational amplifier 88a with a feedback loop 90a. A bypass capacitor 92a is connected between the positive terminals of the operational amplifiers. It is understood that switches 72a and 74a can be embodied as a bank of four CMOS switches as is shown in FIG. 2.

Matched resistors 66b and 68b are connected in series between the outputs of op amp 84a and 88a, respectively. The voltage divider output is compared with the incoming analog signal at a comparator 70b, with the binary output of the comparator controlling a pair of two-position switches 72b and 74b, the outputs of which are provided, respectively, to operational amplifiers 84b and 88b, thus completing the second stage of the A/D converter.

At the final stage, a pair of matching resistors 66n and 68n divides the difference in incoming reference voltages, and supplies a voltage divider output to a comparator 70n, whereupon a binary signal indicates the least significant bit of the digital word portraying the incoming analog signal.

As an example, the following components can be utilized in constructing an analog-to-digital converter equivalent to A/D converter 56:

| | |
|---|---|
| Resistor 66a-n | 1K ohms |
| Resistor 68a-n | 1K ohms |
| Switch 72a-n | CD 4016B (National Semiconductor) |
| Switch 74a-n | CD 4016B (National Semiconductor) |
| Resistor 76a-n | 5.1K ohms |
| Resistor 78a-n | 5.1K ohms |
| Resistor 80 | 5.1K ohms |
| Resistor 82 | 5.1K ohms |
| Comparator 70a-n | LM 211 (Texas Instruments) |
| Operational Amplifier 84a-n | AD 711 (Analog Devices) |
| Operational Amplifier 88a-n | AD 711 |
| Coupling Capacitor 92a-n | 0.01 microfarads |

A/D converter 56, as compared to first embodiment A/D converter 16, requires additional circuit components in each stage. While these added components increase the complexity of the circuit, they also enhance reliability and can reduce cost in certain applications. This can be understood from consideration of resistors 26 and 28 of the first embodiment voltage divider. The available range of values for these resistors is limited. First, the resistance must be sufficiently large to overcome the influence of the inherent resistance in the switches that follow. At the same time, too large a resistance in these resistors slows down operation of the A/D converter.

By contrast, in A/D converter 56, operational amplifier 84a isolates switch 72a from resistor 66b, while operational amplifier 88a similarly isolates switch 74a from resistor 68b.

This isolation by operational amplifiers 84 and 88 permits the use of alternative switches, with higher inherent resistance but affording higher speed at less cost. In fact, resistors 76, 78, 80 and 82 in each stage add to the inherent switch resistance, to limit the current through the switches. As a result, switches 72a and 74a can make before break without materially altering the circuit behavior. Yet another benefit of the reduced current is that a relatively small capacitance in capacitor 92 of each stage can achieve effective transient suppression.

A primary benefit of employing either A/D converter 16 or A/D converter 56 is the linear relationship between the number of components required and the number of stages. This benefit is the most meaningful in applications requiring a high degree of precision and therefore a large number of stages in the converter. Further advantages reside in the fact that these converters do not require clocking, nor, in most instances, do they require any auxiliary sample and hold circuitry.

What is claimed is:

1. A multiple stage analog-to-digital converter, including:
   an analog input terminal for receiving an analog voltage, a first reference terminal biased to a first predetermined voltage greater than the analog voltage, and a second reference terminal biased to a second predetermined voltage less than the analog voltage; and
   a plurality of stages of circuitry connected to said terminals for generating a binary word of n bits corresponding to said analog voltage, wherein n is an integer;
   each of said stages including a voltage dividing means for receiving first and second reference voltage signals and generating a divider output voltage halfway between the voltage levels of said first and second reference voltage signals; a comparator means, having as inputs said analog voltage and a comparator reference input voltage substantially equal to said divider output voltage, for generating a first binary signal whenever said analog voltage is greater than said comparator reference input voltage, and a second binary signal whenever said analog voltage is less than said comparator reference input voltage; a buffering element for receiving said divider output voltage and generating a buffering output voltage dependent upon said divider output voltage; and a switching means receiving as voltage inputs said first reference voltage, second reference voltage and buffering output voltage, and further receiving said binary signal as a control input, said switching means being configured to break before make and generating said first reference voltage and buffering output voltage as first and second switching output voltages, respectively, responsive to receiving said first binary signal as said control input, and generating said buffering output voltage and said second reference voltage as said first and second switching output voltages, respectively, responsive to receiving said second binary signal as said control input;
   wherein said first and second predetermined voltages comprise the first and second reference voltages to the first one of said stages, and the first and second switching output voltages of each stage comprise substantially the first and second reference voltages provided to the next subsequent one of said stages, and said comparators cooperate to generate a binary word of n bits corresponding to said analog voltage.

2. The analog-to-digital converter of claim 1 wherein:
   each of said dividing means includes first and second dividing resistors of substantially equal resistance connected in series, with the output of each dividing means positioned between its associated first and second dividing resistors.

3. The analog-to-digital converter of claim 1 further including:
   a binary register means for receiving and holding the binary signals of said comparator means of said stages.

4. The analog-to-digital converter of claim 2 wherein:
   said buffering element comprises a unity gain following means receiving the output of its associated one of said dividing means and provides said buffering output voltage to its associated one of said switching means.

5. The analog-to-digital converter of claim 4 wherein:
   each of said unity gain following means comprises an operational amplifier.

6. The analog-to-digital converter of claim 5 wherein:
   said second predetermined voltage is ground.

7. The analog-to-digital converter of claim 2 wherein:

the resistance of all of said first dividing resistors and second dividing resistors is substantially the same.

8. The analog-to-digital converter of claim 1 wherein: each of said switching means includes a bank of four CMOS switches including first and second CMOS switches closed responsive to receiving said first binary signal from their associated comparator means, and third and fourth CMOS switches closed responsive to receiving said second digital output from said comparator means.

9. A multiple stage analog-to-digital converter, including:
an analog input terminal for receiving an analog voltage, a first reference terminal biased to a first predetermined voltage greater than the analog voltage, and a second reference terminal biased to a second predetermined voltage less than the analog voltage; and
a plurality of stages of circuitry connected to said terminals for generating a binary word of n bits corresponding to said analog voltage, wherein n is an integer;
each of said stages including a voltage dividing means for receiving first and second reference voltage signals and generating a divider output voltage halfway between the voltage levels of said first and second reference voltage signals; a comparator means, having as inputs said analog voltage and said divider output voltage, for generating a first binary signal whenever said analog voltage is greater than said divider output voltage, and a second binary signal whenever said analog voltage is less than said divider output voltage; and a switching means receiving as voltage inputs said first reference voltage, second reference voltage and divider output voltage, and further receiving said binary signal as a control input, said switching means generating said first reference voltage and divider output voltage as first and second switching output voltages, respectively, responsive to receiving said first binary signal as said control input, and generating said divider output voltage and said second reference voltage as said first and second switching output voltages, respectively, responsive to receiving said second binary signal as said control input; and
a first buffering element comprising a unity gain follower means between the first switching output of each of said switching means and the next subsequent one of said stages, and a second buffering element comprising a unity gain follower means between the second switching output of said switching means and said subsequent stage.

10. The analog-to-digital converter of claim 9 further including:
a bypass capacitor between said first and second unity gain follower means.

11. The analog-to-digital converter of claim 9 wherein:
said first and second unity gain follower means comprise operational amplifiers.

12. The analog-to-digital converter of claim 11 further including:
first, second and third substantially equal auxiliary resistances connected in series between each of said switching means and said first reference voltage, second reference voltage and divider output voltage, respectively.

13. The analog-to-digital converter of claim 9 wherein:
each of said dividing means includes first and second dividing resistors connected in series, with the output of each dividing means positioned between its associated first and second dividing resistors, and wherein all of said first and second dividing resistors have substantially the same resistance.

* * * * *